(12) United States Patent
Chen et al.

(10) Patent No.: US 10,979,076 B2
(45) Date of Patent: Apr. 13, 2021

(54) ENCODING METHOD, ENCODING APPARATUS, AND COMMUNICATIONS APPARATUS

(71) Applicant: HUAWEI TECHNOLOGIES CO., LTD., Guangdong (CN)

(72) Inventors: Ying Chen, Hangzhou (CN); Rong Li, Hangzhou (CN); Huazi Zhang, Hangzhou (CN); Jian Wang, Hangzhou (CN); Jun Wang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/572,163

(22) Filed: Sep. 16, 2019

(65) Prior Publication Data

US 2020/0014403 A1 Jan. 9, 2020

Related U.S. Application Data

(63) Continuation of application No. PCT/CN2018/078901, filed on Mar. 14, 2018.

(30) Foreign Application Priority Data

Mar. 17, 2017 (CN) .......................... 2017 1 0162011

(51) Int. Cl.
*H03M 13/00* (2006.01)
*H03M 13/13* (2006.01)
*H04L 1/00* (2006.01)

(52) U.S. Cl.
CPC .......... *H03M 13/13* (2013.01); *H04L 1/0013* (2013.01); *H04L 1/0057* (2013.01)

(58) Field of Classification Search
None
See application file for complete search history.

(56) References Cited

U.S. PATENT DOCUMENTS

2014/0173376 A1* 6/2014 Jeong ................ H03M 13/2915
714/755
2015/0263767 A1 9/2015 Shin et al.
(Continued)

FOREIGN PATENT DOCUMENTS

| CN | 101227193 A | 7/2008 |
| CN | 103023618 A | 4/2013 |
| CN | 105075163 A | 11/2015 |

OTHER PUBLICATIONS

M. El-Khamy, H. Lin, J. Lee, H. Mandavifar and I. Kang, "HARQ Rate-Compatible Polar Codes for Wireless Channels," 2015 IEEE Global Communications Conference (GLOBECOME), San Diego, CA, 2015, pp. 1-6, doi: 10.1109/GLOCOM.2015.7417429. (Year: 2015).*

(Continued)

*Primary Examiner* — Daniel F. McMahon
(74) *Attorney, Agent, or Firm* — Womble Bond Dickinson (US) LLP

(57) ABSTRACT

A method includes: obtaining a first sequence corresponding to a basic code length $N_0$; determining N to-be-encoded bits, where the N to-be-encoded bits include N2 fixed bits, and N is greater than the basic code length $N_0$; extending the first sequence to obtain a second sequence; determining locations of the N2 fixed bits in the N to-be-encoded bits based on polar channel serial numbers indicated by first N2 elements in the second sequence; and performing polar encoding on the N to-be-encoded bits to obtain encoded bits. The locations of the fixed bits in the N to-be-encoded bits are determined based on the second sequence, and the second sequence is obtained by extending the first sequence corresponding to the basic code length $N_0$.

21 Claims, 7 Drawing Sheets

(56) References Cited

U.S. PATENT DOCUMENTS

| | | | |
|---|---|---|---|
| 2017/0047947 A1 | 2/2017 | Hong et al. | |
| 2018/0278272 A1* | 9/2018 | Li | H03M 13/6393 |
| 2018/0351695 A1* | 12/2018 | Yang | H04L 1/0045 |
| 2019/0373589 A1* | 12/2019 | Hwang | H04L 1/00 |
| 2020/0021315 A1* | 1/2020 | Chen | H03M 13/13 |
| 2020/0021392 A1* | 1/2020 | Xu | H04L 1/0043 |

OTHER PUBLICATIONS

3GPP TSG RAN WG1 Meeting #86bis, R1-1608862, Huawei, HiSilicon:"Polar Code Construction for NR", Lisbon, Portugal, Oct. 10-14, 2016. 8 pages.

Qualcomm Inc.:"Design of Polar codes for control channel", 3GPP Draft, R1-1700832, RAN WG1, Spokane, USA, XP051208351, 6 pages.

Jingbo Liu et al:Frozen bits selection for polar codes based on simulation and BP decoding, IEICE Electronics Express, vol. 14, No. 6, Feb. 27, 2017. pp. 1-6.

Qualcomm Inc.:"Polar code information bit allocation and nested extension construction", 3GPP draft R1-1702646, RAN WG1, Athens, Greece, XP051208711, 14 pages.

Niu Kai et al: "Polar codes: Primary concepts and practical decoding algorithms", IEEE Communications Magazine, vol. 52, No. 7, Jul. 2014, XP011553413, 12 pages.

\* cited by examiner

ENCODING METHOD, ENCODING APPARATUS, AND COMMUNICATIONS APPARATUS

CROSS-REFERENCE TO RELATED APPLICATIONS

This application is a continuation of International Application No. PCT/CN2018/078901, filed on Mar. 14, 2018, which claims priority to Chinese Patent Application No. 201710162011.3, filed on Mar. 17, 2017. The disclosures of the aforementioned applications are hereby incorporated by reference in their entireties.

TECHNICAL FIELD

Embodiments of the present disclosure relate to the communications field, and more specifically, to an encoding method, an encoding apparatus, and a communications apparatus.

BACKGROUND

In a communications system, channel encoding is usually used to improve data transmission reliability, to ensure communication quality. The polar code proposed by a Turkish professor, Arikan, is the first high-performance code that has been theoretically proved to be capable of achieving a Shannon capacity and that has low encoding/decoding complexity. The polar code is a linear block code, and an encoding matrix of the polar code is $G_N$. For example, an encoding process is $x_1^N = u_1^N G_N$, where $u_1^N = (u_1, u_2, K, u_N)$ is a binary row vector with a length of N (namely, a mother code length), $G_N$ is an N×N matrix, and $G_N = F_2^{\otimes (\log_2(N))}$, and $F_2^{\otimes (\log_2(N))}$ is defined as a Kronecker product of $\log_2 N$ matrices $F_2$.

The matrix $$F_2 = \begin{bmatrix} 1 & 0 \\ 1 & 1 \end{bmatrix}.$$

In the encoding process of the polar code, some bits in $u_1^N$ are used to carry information and are referred to as information bits, and an index set of these bits is denoted as A; and the other bits are set to a fixed value that is agreed on by a transmit end and a receive end in advance and are referred to as fixed bits or frozen bits, and an index set of these bits is represented by $A^c$ that is a complementary set of A. The encoding process of the polar code is equivalent to $x_1^N = u_A G_N(A) \oplus u_{A^c} G_N(A^c)$ Herein, $G_N(A)$ is a submatrix obtained based on rows corresponding to indexes in the set A in $G_N$, and $G_N(A^c)$ is a submatrix obtained based on rows corresponding to indexes in the set $A^C$ in $G_N$. $u_A$ is a set of the information bits in $u_1^N$, and a quantity of information bits is K. $u_{A^c}$ is a set of the fixed bits in $u_1^N$ a quantity of fixed bits is (N−K), and the fixed bits are known bits. These fixed bits are usually set to 0. However, the fixed bits may be set to any value provided that the value is agreed on by the transmit end and the receive end in advance. When the fixed bits are set to 0, encoding output of the polar code may be simplified as: $x_1^N = u_A G_N(A)$, where $G_N(A)$ is a K×N matrix.

A polar code construction process is a selection process of the set A. This determines performance of the polar code. A polar code construction process is provided in the prior art and includes: determining, based on the mother code length N, that there are a total of N polar channels that respectively correspond to N rows of the encoding matrix; calculating reliability of the polar channels; and using indexes of first K polar channels with relatively high reliability as elements in the set A, and using indexes corresponding to remaining (N−K) polar channels as elements in the index set $A^c$ of the fixed bits. Locations of the information bits are determined based on the set A, and locations of the fixed bits are determined based on the set $A^c$. Common measures of the reliability of the polar channel include an error probability, a channel capacity, a polarization weight, and the like.

In the foregoing polar code construction process, for a different mother code length N, reliability of polar channels is determined through online calculation, and further locations of information bits and locations of fixed bits are determined. The online calculation increases complexity on an encoding side.

SUMMARY

Embodiments of the disclosure provide an encoding method, an encoding apparatus, and a communications apparatus, to improve performance of a polar code.

According to a first aspect, an encoding method is provided, including:

obtaining a first sequence corresponding to a basic code length $N_0$, where the first sequence includes serial numbers of $N_0$ polar channels corresponding to the basic code length $N_0$;

determining N to-be-encoded bits, where the N to-be-encoded bits include N2 fixed bits, and N is greater than the basic code length $N_0$;

extending the first sequence to obtain a second sequence;

determining locations of the N2 fixed bits in the N to-be-encoded bits based on polar channel serial numbers indicated by first N2 elements in the second sequence; and performing polar encoding on the N to-be-encoded bits to obtain encoded bits.

With reference to the first aspect, in a first possible implementation of the first aspect, the extending the first sequence to obtain a second sequence includes:

(a) using the first sequence as a to-be-extended sequence and extending the first sequence to obtain a third sequence, where the third sequence includes the to-be-extended sequence and an extension sequence, a length of the extension sequence is the same as a length of the to-be-extended sequence, and each element in the extension sequence is equal to an element located at a same location in the to-be-extended sequence plus the length of the to-be-extended sequence;

(b) inserting the first element in the extension sequence into the to-be-extended sequence in the third sequence to form a fourth sequence, where a length of the fourth sequence is the same as a length of the third sequence;

(c) comparing an insertion location at which the first element in the extension sequence is inserted into the to-be-extended sequence with the quantity N2 of fixed bits; and when the insertion location is less than N2, proceeding to (d); otherwise, proceeding to (e);

(d) using the fourth sequence as the to-be-extended sequence to continue performing the foregoing (a), (b), and (c); and (e) using the fourth sequence as the second sequence.

With reference to the first aspect, in a second possible implementation of the first aspect, the extending the first sequence to obtain a second sequence includes:

determining a quantity K of extension times; and using the first sequence as a to-be-extended sequence and extending the first sequence for K times to obtain a sequence that is extended for K times, and using the sequence that is extended for K times as the second sequence, where a sequence obtained after each time of extension is used as a to-be-extended sequence for a next time of extension, the sequence obtained after each time of extension includes a to-be-extended sequence and an extension sequence, a length of the extension sequence is the same as a length of the to-be-extended sequence, and each element in the extension sequence is equal to an element located at a same location in the to-be-extended sequence plus the length of the to-be-extended sequence.

With reference to the second possible implementation of the first aspect, in a third possible implementation of the first aspect, the determining a quantity K of extension times includes:

determining, through table lookup, an insertion location sequence P corresponding to the basic code length $N_0$; and sequentially comparing each element starting from the first element in the insertion location sequence P with the quantity N2 of fixed bits, until an element not less than N2 is determined, and using, as the quantity K of extension times, a quantity of times of comparison performed starting from the first element until the element not less than N2 is determined.

With reference to any one of the first aspect or the first to the third possible implementations of the first aspect, in a fourth possible implementation of the first aspect, the determining N to-be-encoded bits includes:

determining N based on M, where N=M, M is a target code length that is output based on a polar code, M is equal to 2 raised to the power of a positive integer, and M is a positive integer.

With reference to the fourth possible implementation of the first aspect, in a fifth possible implementation of the first aspect, the determining locations of the N2 fixed bits in the N to-be-encoded bits based on polar channel serial indicated by first N2 elements in the second sequence includes:

using the polar channel serial numbers indicated by the first N2 elements in the second sequence as the locations of the N2 fixed bits in the N to-be-encoded bits.

With reference to any one of the first aspect or the first to the third possible implementations of the first aspect, in a sixth possible implementation of the first aspect, the determining N to-be-encoded bits includes:

determining N based on M, where $N=2^{\lfloor \log_2(M-1) \rfloor + 1}$, the symbol $\lfloor \ \rfloor$ represents rounding down, M is a target code length that is output based on a polar code, M is not equal to 2 raised to the power of a positive integer, and M is a positive integer.

With reference to the sixth possible implementation of the first aspect, in a seventh possible implementation of the first aspect, after the determining N to-be-encoded bits, the method further includes:

determining (M−N) deletion locations, where the (M−N) deletion locations are used to implement rate matching; and correspondingly, the determining locations of the N2 fixed bits in the N to-be-encoded bits based on polar channel serial numbers indicated by first N2 elements in the second sequence includes:

determining that there are S deletion locations in the first N2 elements in the second sequence, where 0≤S≤(M−N); and using first (N2−M+N) elements in a fifth sequence and the (M−N) deletion locations as the locations of the N2 fixed bits in the N to-be-encoded bits, where the fifth sequence is a sequence including elements other than the S deletion locations in the first N2 elements in the second sequence.

With reference to any one of the first aspect or the first to the seventh possible implementations of the first aspect, in an eighth possible implementation of the first aspect, the obtaining a first sequence corresponding to the basic code length $N_0$ includes:

obtaining, through table lookup, the first sequence corresponding to the basic code length $N_0$.

With reference to any one of the first aspect or the first to the seventh possible implementations of the first aspect, in a ninth possible implementation of the first aspect, the obtaining a first sequence corresponding to the basic code length $N_0$ includes:

determining the first sequence based on reliability of the $N_0$ polar channels corresponding to the basic code length $N_0$.

According to a second aspect, an encoding apparatus is provided, including:

an obtaining module, configured to obtain a first sequence corresponding to a basic code length $N_0$, where the first sequence includes serial numbers of $N_0$ polar channels corresponding to the basic code length $N_0$;

a first determining module, configured to determine N to-be-encoded bits, where the N to-be-encoded bits include N2 fixed bits, and N is greater than the basic code length $N_0$;

an extension module, configured to extend the first sequence obtained by the obtaining module, to obtain a second sequence;

a second determining module, configured to determine locations of the N2 fixed bits in the N to-be-encoded bits based on polar channel serial numbers indicated by first N2 elements in the second sequence obtained by the extension module through extension; and an encoding module, configured to perform polar encoding on the N to-be-encoded bits determined by the first determining module, to obtain encoded bits.

With reference to the second aspect, in a first possible implementation of the second aspect, the extension module is specifically configured to:

(a) use the first sequence as a to-be-extended sequence and extend the first sequence to obtain a third sequence, where the third sequence includes the to-be-extended sequence and an extension sequence, a length of the extension sequence is the same as a length of the to-be-extended sequence, and each element in the extension sequence is equal to an element located at a same location in the to-be-extended sequence plus the length of the to-be-extended sequence;

(b) insert the first element in the extension sequence into the to-be-extended sequence in the third sequence to form a fourth sequence, where a length of the fourth sequence is the same as a length of the third sequence;

(c) compare an insertion location at which the first element in the extension sequence is inserted into the to-be-extended sequence with the quantity N2 of fixed bits; and when the insertion location is less than N2, proceed to (d); otherwise, proceed to (e);

(d) use the fourth sequence as the to-be-extended sequence to continue performing the foregoing (a), (b), and (c); and (e) use the fourth sequence as the second sequence.

With reference to the second aspect, in a second possible implementation of the second aspect, the extension module includes:

a determining submodule, configured to determine a quantity K of extension times; and an extension submodule, configured to: use the first sequence as a to-be-extended sequence and extend the first sequence for K times to obtain a sequence that is extended for K times, and use the sequence that is extended for K times as the second sequence, where a sequence obtained after each time of extension is used as a to-be-extended sequence for a next time of extension, the sequence obtained after each time of extension includes a to-be-extended sequence and an extension sequence, a length of the extension sequence is the same as a length of the to-be-extended sequence, and each element in the extension sequence is equal to an element located at a same location in the to-be-extended sequence plus the length of the to-be-extended sequence.

With reference to the second possible implementation of the second aspect, in a third possible implementation of the second aspect, the determining submodule is specifically configured to:

determine, through table lookup, an insertion location sequence P corresponding to the basic code length $N_0$; and sequentially compare each element starting from the first element in the insertion location sequence P with the quantity N2 of fixed bits, until an element not less than N2 is determined, and use, as the quantity K of extension times, a quantity of times of comparison performed starting from the first element until the element not less than N2 is determined.

With reference to any one of the second aspect or the first to the third possible implementations of the second aspect, in a fourth possible implementation of the second aspect, the first determining module is specifically configured to:

determine N based on M, where N=M, M is a target code length that is output based on a polar code, M is equal to 2 raised to the power of a positive integer, and M is a positive integer.

With reference to the fourth possible implementation of the second aspect, in a fifth possible implementation of the second aspect, the second determining module is specifically configured to:

use the polar channel serial numbers indicated by the first N2 elements in the second sequence as the locations of the N2 fixed bits in the N to-be-encoded bits.

With reference to any one of the second aspect or the first to the third possible implementations of the second aspect, in a sixth possible implementation of the second aspect, the first determining module is specifically configured to:

determine N based on M, where $N=2^{\lfloor log_2(M-1) \rfloor+1}$ the symbol $\lfloor \rfloor$ represents rounding down, M is a target code length that is output based on a polar code, M is not equal to 2 raised to the power of a positive integer, and M is a positive integer.

With reference to the sixth possible implementation of the second aspect, in a seventh possible implementation of the second aspect, the encoding apparatus further includes:

a third determining unit, configured to determine (M−N) deletion locations, where the (M−N) deletion locations are used to implement rate matching; and correspondingly, the second determining module is specifically configured to:

determine that there are S deletion locations in the first N2 elements in the second sequence, where 0≤S≤(M−N); and use first (N2−M+N) elements in a fifth sequence and the (M−N) deletion locations as the locations of the N2 fixed bits in the N to-be-encoded bits, where the fifth sequence is a sequence including elements other than the S deletion locations in the first N2 elements in the second sequence.

With reference to any one of the second aspect or the first to the seventh possible implementations of the second aspect, in an eighth possible implementation of the second aspect, the obtaining module is specifically configured to:

obtain, through table lookup, the first sequence corresponding to the basic code length $N_0$.

With reference to any one of the second aspect or the first to the seventh possible implementations of the second aspect, in a ninth possible implementation of the second aspect, the obtaining module is specifically configured to:

determine the first sequence based on reliability of the $N_0$ polar channels corresponding to the basic code length $N_0$.

According to a third aspect, a communications apparatus is provided, including:

a memory, configured to store a program; and a processor, configured to execute the program stored in the memory, where when the program is executed, the processor is configured to perform any one of the first aspect or the possible implementations of the first aspect.

According to another aspect, the disclosure provides a computer readable storage medium. The computer readable storage medium stores an instruction. When the instruction is run on a computer, the computer is enabled to perform the method according to the foregoing aspect.

According to another aspect, the disclosure provides a computer program product including an instruction. When the instruction is run on a computer, the computer is enabled to perform the method according to the foregoing aspect.

According to another aspect, the disclosure provides a computer program. When the computer program is run on a computer, the computer is enabled to perform the method according to the foregoing aspect.

In the embodiments of the disclosure, the locations of the fixed bits in the N to-be-encoded bits are determined based on the second sequence, and the second sequence is obtained by extending the first sequence corresponding to the basic code length $N_0$. Compared with the prior art in which locations of fixed bits need to be determined by online calculating reliability of polar channels, this can reduce complexity of determining locations of fixed bits during polar code construction, and further reduce complexity of determining locations of information bits during the polar code construction, thereby improving performance of the polar code.

DESCRIPTION OF EMBODIMENTS

Figure 1:
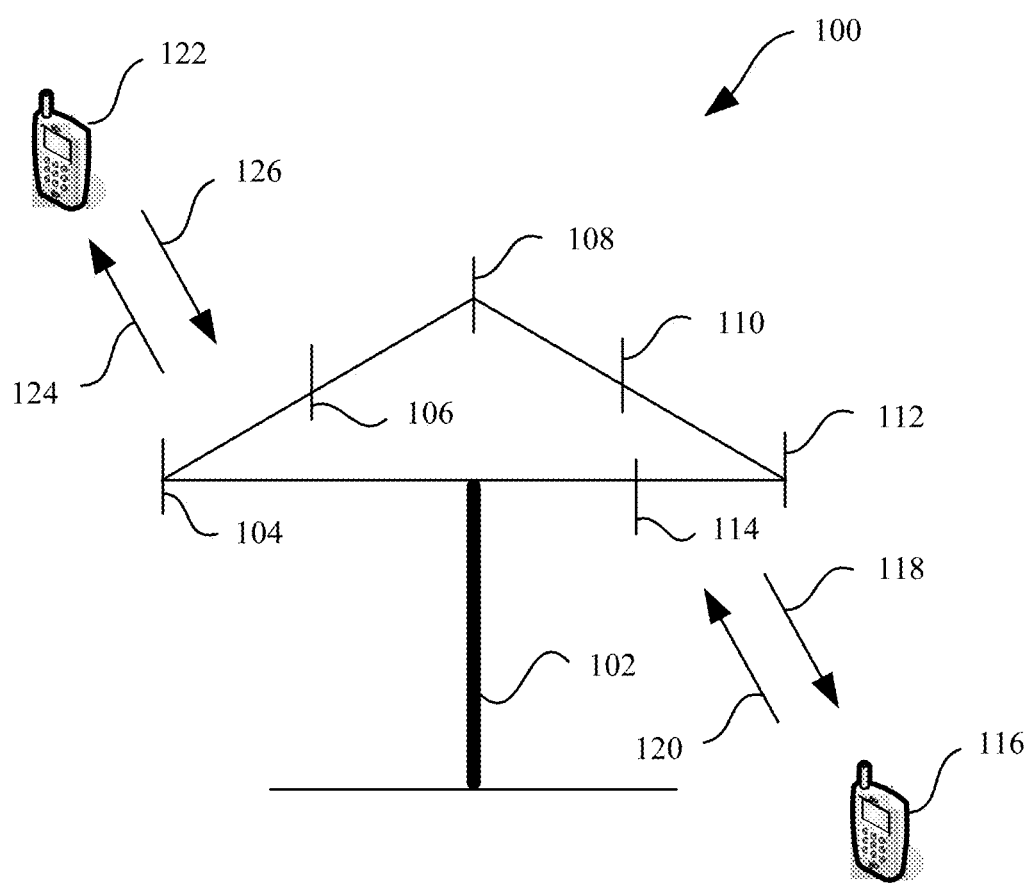
FIG. 1 shows a structure of a wireless communications system according to the disclosure.

The embodiments of the present disclosure may be applied to various communications systems. Therefore, the following descriptions are not limited to a particular communications system. The various communications systems include global system for mobile communications (GSM), a code division multiple access (CDMA) system, a wideband code division multiple access (WCDMA) system, a general packet radio service (GPRS), a long term evolution LTE) system, an LTE frequency division duplex (FDD) system, an LTE time division duplex (TDD) system, a universal mobile telecommunications system (UMTS), and the like. Information or data encoded by a base station or a terminal in the foregoing systems by using a conventional turbo code or LDPC code all can be encoded by using a polar code in the embodiments.

The terms such as "component", "module", and "system" used in this specification are used to represent computer-related entities, hardware, firmware, combinations of hardware and software, software, or software being executed. For example, a component may be but is not limited to a process that is run on a processor, a processor, an object, an executable file, an execution thread, a program, and/or a computer. As shown in figures, both an application that runs on a computing device and the computing device may be components. One or more components may reside within a process and/or an execution thread, and a component may be located on one computer and/or distributed between two or more computers. In addition, these components may be executed from various computer readable media that store various data structures. The components may communicate by using a local and/or remote process and according to, for example, a signal having one or more data packets (for example, data from two components interacting with another component in a local system, a distributed system, and/or across a network such as the Internet interacting with other systems by using the signal).

In addition, the embodiments are described with reference to an access terminal. The access terminal may also be referred to as a system, a subscriber unit, a subscriber station, a mobile station, a mobile console, a remote station, a remote terminal, a mobile device, a user terminal, a terminal, a wireless communications device, a user agent, a user apparatus, or UE (User Equipment). The access terminal may be a cellular phone, a cordless phone, a SIP (Session Initiation Protocol) phone, a WLL (Wireless Local Loop) station, a PDA (Personal Digital Assistant), a handheld device having a wireless communication function, a computing device, or another processing device connected to a wireless modem. In addition, the embodiments are described with reference to a base station. The base station may be configured to communicate with a mobile device. The base station may be a BTS (Base Transceiver Station) in GSM (Global System of Mobile communication) or CDMA (Code Division Multiple Access); or may be an NB (NodeB) in WCDMA (Wideband Code Division Multiple Access); or may be an eNB or an eNodeB (evolved NodeB) in LTE (Long Term Evolution), a relay station, an access point, a base station device in a future 5G network, or the like.

Currently, FIG. 1 shows a wireless communications system 100 according to the embodiments in this specification. The system 100 includes a base station 102. The base station 102 may include a plurality of antenna groups. For example, one antenna group may include antennas 104 and 106, another antenna group may include antennas 108 and 110, and an additional group may include antennas 112 and 114. For each antenna group, two antennas are shown. However, each group may include more or fewer antennas. The base station 102 may additionally include a transmitter chain and a receiver chain. A person of ordinary skill in the art may understand that both the transmitter chain and the receiver chain may include a plurality of components related to signal sending and receiving (for example, a processor, a modulator, a multiplexer, a demodulator, a demultiplexer, or an antenna).

The base station 102 may communicate with one or more access terminals (for example, an access terminal 116 and an access terminal 122). However, it may be understood that the base station 102 may basically communicate with any quantity of access terminals similar to the access terminals 116 and 122. The access terminals 116 and 122 may be, for example, cellular phones, smartphones, portable computers, handheld communications devices, handheld computing devices, satellite radio apparatuses, global positioning systems, PDAs, and/or any other appropriate devices configured to perform communication in the wireless communications system 100. As shown in FIG. 1, the access terminal 116 communicates with the antennas 112 and 114. The antennas 112 and 114 send information to the access terminal 116 through a forward link 118, and receive information from the access terminal 116 through a reverse link 120. In addition, the access terminal 122 communicates with the antennas 104 and 106. The antennas 104 and 106 send information to the access terminal 122 through a forward link 124, and receive information from the access terminal 122 through a reverse link 126. In an FDD (Frequency Division Duplex) system, for example, the forward link 118 may use a frequency band different from a frequency band used by the reverse link 120, and the forward link 124 may use a frequency band different from a frequency band used by the reverse link 126. In addition, in a TDD (Time Division Duplex) system, the forward link 118 and the reverse link 120 may use a same frequency band, and the forward link 124 and the reverse link 126 may use a same frequency band.

Each group of antennas and/or an area that are/is designed for communication is referred to as a sector of the base station 102. For example, an antenna group may be designed to communicate with an access terminal in a sector of a coverage area of the base station 102. During communication through the forward links 118 and 124, a transmit antenna of the base station 102 may increase signal-to-noise ratios of the forward links 118 and 124 for the access terminals 116 and 122 through beamforming. In addition, compared with a case in which the base station performs, by using a single antenna, sending with an access terminal served by the base station, when the base station 102 performs, through beamforming, sending with the access terminals 116 and 122 that are randomly scattered in the related coverage area, less interference is caused to a mobile device in a neighboring cell.

In a given time, the base station 102, the access terminal 116 and/or the access terminal 122 may be a wireless communication sending apparatus and/or a wireless communication receiving apparatus. When sending data, the wireless communication sending apparatus may encode the data for transmission. Specifically, the wireless communication sending apparatus may have (for example, generate, obtain, or store in a memory) a particular quantity of information bits that need to be sent to the wireless communication receiving apparatus through a channel. The information bits may be included in a transport block (or a plurality of transport blocks) of data, and the transport block may be segmented to generate a plurality of code blocks. In addition, the wireless communication sending apparatus may encode each code block by using a polar code encoder (not shown).

Figure 2A:
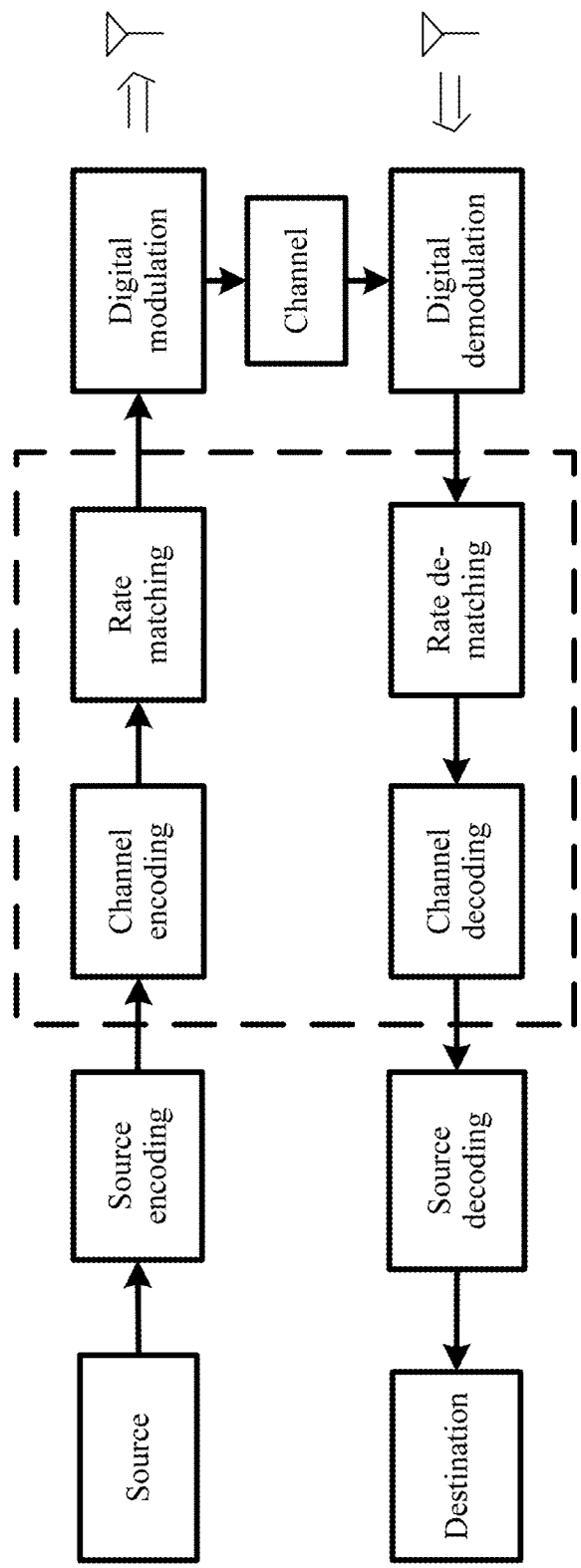
FIG. 2a is a schematic diagram of a basic procedure of wireless communication between a transmit end and a receive end.

FIG. 2a shows a basic procedure of wireless communication. At a transmit end, a signal is sent from a source after source encoding, channel encoding, and digital modulation are sequentially performed on the signal. At a receive end, the signal is output to a destination after digital demodulation, channel decoding, and source decoding are sequentially performed on the signal. A polar code may be used for the channel encoding/decoding. A code length of an original polar code (a mother code) is 2 raised to the power of an integer. Therefore, during actual application, rate matching needs to be performed to implement a polar code with any code length. As shown in FIG. 2a, at the transmit end, rate matching is performed after the channel encoding, to implement any target code length; and at the receive end, rate de-matching is performed before the channel decoding.

Figure 2B:
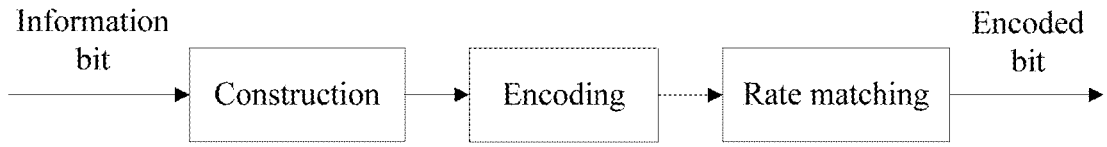
FIG. 2b is a schematic diagram of an encoding process of a polar code according to an embodiment of the disclosure.

As shown in FIG. 2b, an encoding process of a polar code includes three processing processes: construction, encoding, and rate matching.

First, in the construction process: N1 input information bits are received; a quantity N of to-be-encoded bits is determined based on a target code length M obtained after encoding, where the N to-be-encoded bits include N1 information bits and N2 fixed bits; and locations of the N1 information bits and locations of the N2 fixed bits further need to be determined, where one bit (information bit or fixed bit) corresponds to one polar channel. Then, in the encoding process: polar encoding is performed on the to-be-encoded bits to obtain bits obtained after the polar encoding. A mother code length obtained after the polar code encoding is 2 raised to the power of a positive integer, and a target code length that is output based on the polar code may be 2 raised to the power of a positive integer or may not be 2 raised to the power of a positive integer. When the target code length that is output based on the polar code is 2 raised to the power of a positive integer, rate matching does not need to be performed. When the target code length that is output based on the polar code is not 2 raised to the power of a positive integer, rate matching needs to be performed. Therefore, the polar code encoding may further include the rate matching process: A code length (that is, the mother code length) obtained after the polar code encoding is 2 raised to the power of a positive integer. However, during actual application, rate matching usually needs to be performed to implement a polar code with any code length, and the rate matching usually may be implemented by using a puncturing or shortening scheme. In a specific implementation, some N−M bits are deleted from the code length that is 2 raised to the power of a positive integer, to obtain a target code length. N, M, N1, and N2 are all positive integers.

An encoding method provided in the embodiments of the present disclosure relates to the polar code encoding process shown in FIG. 2b, and mainly relates to how to determine the locations of the fixed bits and the locations of the information bits in the construction process. An embodiment of the present disclosure provides an encoding method: A sequence corresponding to a basic code length is extended to obtain an extended sequence, and locations of a fixed bit and an information bit in to-be-encoded bits are determined based on the extended sequence.

Figure 3:
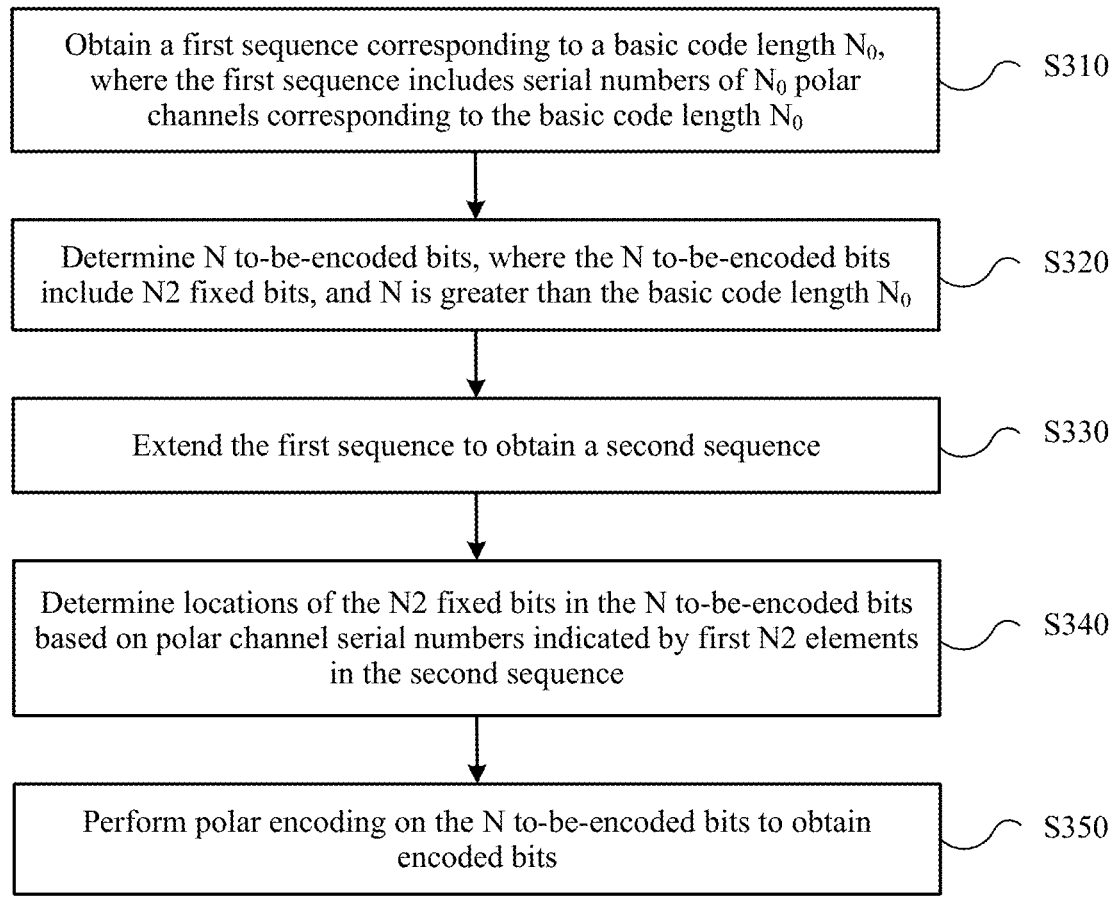
FIG. 3 is a schematic flowchart of an encoding method 300 according to an embodiment of the disclosure.

FIG. 3 is a flowchart 300 of an encoding method according to an embodiment of the present disclosure. Specifically, the embodiment includes the following operations.

Operation S310. Obtain a first sequence corresponding to a basic code length $N_0$, where the first sequence includes serial numbers of $N_0$ polar channels corresponding to the basic code length $N_0$.

It may be learned from the foregoing that the first sequence includes $N_0$ elements, and each element indicates a serial number of one polar channel.

In the present disclosure, a quantity of elements included in a sequence is a length of the sequence. Because the first sequence includes the $N_0$ elements, a length of the first sequence is $N_0$.

For example, the first sequence may be represented as $Q_1^{N_0}=[Q_1 Q_2 \ldots Q_{N_0}]$, where $Q_i$ is used to represent a serial number of a polar channel, and $1 \le i \le N_0$.

For example, the basic code length $N_0$ may be 8, 16, 32, 64, or 128.

In an embodiment of the present disclosure, the first sequence corresponding to the basic code length $N_0$ may be stored in a communications system in a form of a table. The following Table 1 shows first sequences corresponding to different basic code lengths $N_0$.

TABLE 1

| $N_0$ | First sequence |
|---|---|
| 8 | 1, 2, 3, 5, 4, 6, 7, 8 |
| 16 | 1, 2, 3, 5, 9, 4, 6, 7, 10, 11, 13, 8, 12, 14, 15, 16 |
| 32 | 1, 2, 3, 5, 9, 17, 4, 6, 7, 10, 11, 18, 13, 19, 21, 8, 25, 12, 14, 20, 15, 22, 23, 26, 27, 29, 16, 24, 28, 30, 31, 32 |
| 64 | 1, 2, 3, 5, 9, 17, 4, 33, 6, 7, 10, 11, 18, 13, 19, 34, 21, 35, 8, 25, 37, 12, 41, 14, 20, 15, 49, 22, 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64 |
| 128 | 1, 2, 3, 5, 9, 17, 4, 33, 6, 7, 10, 65, 1118, 13, 19, 34, 21, 35, 8, 25, 37, 66, 12, 67, 41, 14, 20, 69, 15, 49, 22, 73, 36, 23, 26, 38, 81, 27, 39, 68, 42, 29, 97, 70, 43, 16, 50, 71, 45, 74, 51, 24, 75, 53, 82, 28, 77, 40, 83, 57, 30, 98, 85, 44, 31, 99, 72, 46, 89, 52, 101, 47, 76, 54, 105, 78, 55, 84, 58, 79, 113, 86, 59, 32, 100, 87, 61, 90, 102, 48, 91, 103, 106, 93, 56, 107, 80, 114, 60, 109, 115, 88, 62, 117, 63, 92, 104, 121, 94, 108, 95, 110, 116, 111, 118, 64, 119, 122, 123, 96, 125, 112, 120, 124, 126, 127, 128 |

It should be noted that Table 1 is merely an example. When an overall effect of the sequence in Table 1 is not affected, an adjustment or an equivalent replacement, including but not limited to an adjustment or an equivalent replacement according to the following several aspects, may be made to the sequence in Table 1:

1. Locations of a few elements in the first sequence are interchanged.

2. The first sequence includes $N_0$ elements starting from 1 to $N_0$, and the $N_0$ elements starting from 1 to $N_0$ represent the serial numbers of the $N_0$ polar channels. Actually, the serial numbers of the $N_0$ polar channels may alternatively start from 0 to $N_0-1$. Therefore, a sequence including $N_0$ elements starting from 0 to $N_0-1$ may be formed by subtracting 1 from each element in each first sequence in Table 1. Certainly, another manner may be alternatively used to indicate the serial numbers or identifiers of the polar channels. The specific expression manner does not affect specific polar channel locations indicated in the table.

In another embodiment of the present disclosure, the first sequence is determined based on reliability of the $N_0$ polar channels corresponding to the basic code length $N_0$. Specifically, for the basic code length $N_0$, the reliability of the $N_0$ polar channels is calculated, and a sequence of the serial numbers of the $N_0$ polar channels, namely, the first sequence, is determined based on the reliability of the $N_0$ polar channels.

For example, $N_0=8$, and the reliability of the $N_0$ polar channels that is calculated in a polarization weight manner is sequentially [0, 1, 1.1892, 2.1892, 1.4142, 2.4142, 2.6034, 3.6034]. The reliability of the $N_0$ polar channels is sorted in ascending order, and a sorting result [1, 2, 3, 5, 4, 6, 7, 8] is the first sequence.

It should be noted that common measures of the reliability of the polar channel include an error probability, a channel capacity, a polarization weight, and the like, and a manner of calculating the reliability of the polar channel is not limited in the present disclosure.

Operation S320. Determine N to-be-encoded bits, where the N to-be-encoded bits include N2 fixed bits, and N is greater than the basic code length $N_0$.

Specifically, the N to-be-encoded bits are determined based on whether rate matching needs to be performed.

In a scenario 1, rate matching does not need to be performed.

N is determined based on M, where N=M, M is used as a target code length that is output based on a polar code and is equal to 2 raised to the power of a positive integer, and M is a positive integer. The N to-be-encoded bits correspond to N polar channels, and one bit corresponds to one polar channel.

In a scenario 2, rate matching needs to be performed.

N is determined based on M, where $N=2^{\lfloor log_2(M-1) \rfloor+1}$, the symbol $\lfloor \ \rfloor$ represents rounding down, M is a target code length that is output based on a polar code, M is not equal to 2 raised to the power of a positive integer, and M is a positive integer.

In this case, locations of (M−N) bits in encoded bits need to be deleted to implement rate matching, and the locations of the (M−N) bits are deletion locations. Specifically, the deletion location may be a puncturing location or a shortening location.

Operation S330. Extend the first sequence to obtain a second sequence.

Specifically, the extending the first sequence to obtain a second sequence may be implemented in the following two manners:

Implementation 1:

Operation S3301. Use the first sequence as a to-be-extended sequence and extend the first sequence to obtain a third sequence, where the third sequence includes the to-be-extended sequence and an extension sequence, a length of the extension sequence is the same as a length of the to-be-extended sequence, and each element in the extension sequence is equal to an element located at a same location in the to-be-extended sequence plus the length of the to-be-extended sequence.

For example, a $j^{th}$ element in the extension sequence is equal to a $j^{th}$ element in the to-be-extended sequence plus the length of the to-be-extended sequence, where $1 \leq j \leq$ the length of the to-be-extended sequence.

The extension sequence is a new sequence obtained through extension based on the to-be-extended sequence, and does not include the to-be-extended sequence. The length of the extension sequence is the same as the length of the to-be-extended sequence. To be specific, the extension sequence and the to-be-extended sequence include a same quantity of elements. In addition, it may be learned from the foregoing that a length of the third sequence is twice the length of the to-be-extended sequence.

Operation S3302. Insert the first element in the extension sequence into the to-be-extended sequence in the third sequence to form a fourth sequence, where a length of the fourth sequence is the same as a length of the third sequence.

Specifically, an insertion location at which the first element in the extension sequence is inserted into the to-be-extended sequence may be determined through table lookup. The insertion location is related to the length of the to-be-extended sequence (namely, the length of the extension sequence). Table 2 shows insertion locations corresponding to to-be-extended sequences with different lengths.

TABLE 2

| | Length of the to-be-extended sequence | | | | | | | |
|---|---|---|---|---|---|---|---|---|
| | 8 | 16 | 32 | 64 | 128 | 256 | 512 | 1024 |
| Insertion location | 5 | 6 | 8 | 12 | 17 | 26 | 41 | 66 |

It should be noted that Table 2 is merely an example. When an overall effect of the sequence in Table 2 is not affected, an adjustment or an equivalent replacement, including but not limited to the following adjustment or equivalent replacement, may be made to the sequence in Table 2: For a to-be-extended sequence with a different length, an insertion location corresponding to the to-be-extended sequence with the different length is adjusted to a neighboring location adjacent to the insertion location.

The insertion location may be specifically a serial number of a polar channel. For example, an insertion location "5" indicates a serial number of the fifth polar channel.

Operation S3303. Compare the insertion location at which the first element in the extension sequence is inserted into the to-be-extended sequence with the quantity N2 of fixed bits; and when the insertion location is less than N2, proceed to operation S3304; otherwise, proceed to operation S3305.

Operation S3304. Use the fourth sequence as a to-be-extended sequence to continue performing the foregoing operations S3301, S3302, and S3303.

Operation S3305. Use the fourth sequence as the second sequence.

Implementation 2:

Operation S3311. Determine a quantity K of extension times.

Specifically, an insertion location sequence P corresponding to the basic code length $N_0$ is first determined through table lookup. For different basic code lengths $N_0$, insertion location sequences P corresponding to the different basic code lengths $N_0$ are as follows:

TABLE 3

| $N_0$ | Insertion location sequence P |
|---|---|
| 8 | 5, 6, 8, 12, 17, 26, 41, 66 |
| 16 | 6, 8, 12, 17, 26, 41, 66 |
| 32 | 8, 12, 17, 26, 41, 66 |
| 64 | 12, 17, 26, 41, 66 |

It should be noted that Table 3 is merely an example. When an overall effect of the sequence in Table 3 is not affected, an adjustment or an equivalent replacement, including but not limited to an adjustment or an equivalent replacement according to the following several aspects, may be made to the sequence in Table 3:

1. A few last elements in the insertion location sequence P are deleted, to reduce a length of the location sequence P.

2. A few elements are added after the last element in the insertion location sequence P, to increase a length of the location sequence P.

After the insertion location sequence P is determined, each element starting from the first element in the insertion location sequence P is sequentially compared with the quantity N2 of fixed bits, until an element not less than N2 is determined, and a quantity of times of comparison performed starting from the first element until the element not less than N2 is determined is used as the quantity K of extension times.

Actually, the quantity of times of comparison performed starting from the first element until the element not less than N2 is determined is also a location of the element not less than N2 in the insertion location sequence P, namely, a ranking of the element not less than N2 in the insertion location sequence P.

For example, the basic code length is $N_0=8$, and the quantity of fixed bits is N2=6. It may be learned, by looking up the foregoing table, that the insertion location sequence corresponding to the basic code length $N_0$ is P=[5, 6, 8, 12, 17, 26, 41, 66]. All elements are sequentially compared with the quantity 6 of fixed bits starting from the first element 5 in the insertion location sequence P, and it is determined that the second element 6 is not less than the quantity 6 of fixed bits. Comparison is performed twice before the second element 6 is determined, and therefore the quantity K of extension times is equal to 2. In other words, the second element 6 is located at the second location in the insertion location sequence P, and therefore the quantity K of extension times is equal to 2.

Operation S3312. Use the first sequence as a to-be-extended sequence and extend the first sequence for K times to obtain a sequence that is extended for K times, and use the sequence that is extended for K times as the second sequence, where a sequence obtained after each time of extension is used as a to-be-extended sequence for a next time of extension, the sequence obtained after each time of extension includes a to-be-extended sequence and an extension sequence, a length of the extension sequence is the same as a length of the to-be-extended sequence, and each element in the extension sequence is equal to an element located at a same location in the to-be-extended sequence plus the length of the to-be-extended sequence.

For example, a $j^{th}$ element in the extension sequence is equal to a $j^{th}$ element in the to-be-extended sequence plus the length of the to-be-extended sequence, where $1 \le j \le$ length of the to-be-extended sequence.

It may be learned from the foregoing that a length of the sequence obtained after each time of extension is twice a length of a to-be-extended sequence existing before the extension.

Operation S340. Determine locations of the N2 fixed bits in the N to-be-encoded bits based on polar channel serial numbers indicated by first N2 elements in the second sequence.

In the two different scenarios in S320, S340 is implemented in different manners.

In the scenario 1 in S320, namely, in a scenario in which rate matching does not need to be performed, S340 specifically includes:

using the polar channel serial numbers indicated by the first N2 elements in the second sequence as the locations of the N2 fixed bits in the N to-be-encoded bits.

In the scenario 2 in S320, namely, in a scenario in which rate matching needs to be performed, there are (M−N) deletion locations in this case, and S340 specifically includes:

determining that there are S deletion locations in the first N2 elements in the second sequence, where $0 \le S \le (M-N)$; and using first (N2−M+N) elements in a fifth sequence and the (M−N) deletion locations as the locations of the N2 fixed bits in the N to-be-encoded bits, where the fifth sequence is a sequence including elements other than the S deletion locations in the first N2 elements in the second sequence.

It may be learned from the foregoing that, when S=0, in other words, when the fifth sequence is equal to the second sequence, there is no deletion location in the first N2 elements in the second sequence, and polar channel serial numbers indicated by first (N2−M+N) elements in the second sequence and the (M−N) deletion locations are used as the locations of the N2 fixed bits in the N to-be-encoded bits; or when S=M−N, in other words, when all the (M−N) deletion locations belong to the first N2 elements in the second sequence, the polar channel serial numbers indicated by the first N2 elements in the second sequence are used as the locations of the N2 fixed bits in the N to-be-encoded bits.

Because the locations of the N2 fixed bits in the N to-be-encoded bits are determined, a remaining location in the N to-be-encoded bits is used as a location of an information bit in the N to-be-encoded bits.

Operation S350. Perform polar encoding on the N to-be-encoded bits to obtain encoded bits.

Specifically, an encoding matrix $F_N$ of the polar code may be used to complete an encoding process of the to-be-encoded bits, to obtain the encoded bits obtained after the polar encoding.

In this embodiment, the locations of the fixed bits in the N to-be-encoded bits are determined based on the second sequence, and the second sequence is obtained by extending the first sequence corresponding to the basic code length $N_0$. Compared with the prior art in which locations of fixed bits need to be determined by online calculating reliability of polar channels, this can reduce complexity of determining locations of fixed bits during polar code construction, and further reduce complexity of determining locations of information bits during the polar code construction, thereby improving performance of the polar code.

Figure 6A:
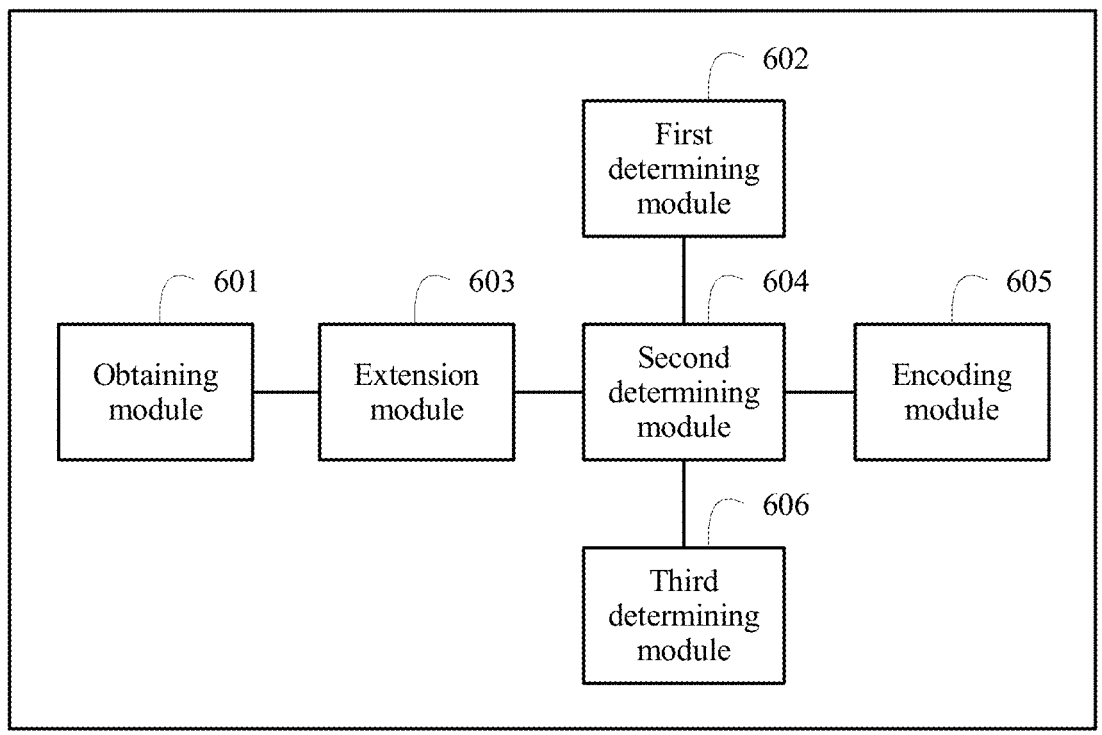
FIG. 6a is a structural diagram of an encoding apparatus 600 according to an embodiment of the disclosure.

The following describes, with reference to FIG. 6a, an encoding apparatus 600 according to an embodiment of the present disclosure. The encoding apparatus 600 includes an obtaining module 601, a first determining module 602, an extension module 603, a second determining module 604, and an encoding module 605.

The obtaining module 601 is configured to obtain a first sequence corresponding to a basic code length $N_0$, where the first sequence includes serial numbers of $N_0$ polar channels corresponding to the basic code length $N_0$.

In an embodiment of the present disclosure, the obtaining module 601 is specifically configured to obtain, through table lookup, the first sequence corresponding to the basic code length $N_0$. The first sequence corresponding to the basic code length $N_0$ may be stored in a communications system in a form of a table. In the foregoing embodiment, Table 1 shows first sequences corresponding to different basic code lengths $N_0$. Details are not described herein again.

In another embodiment of the present disclosure, the obtaining module 601 is specifically configured to determine the first sequence based on reliability of the $N_0$ polar channels corresponding to the basic code length $N_0$. Specifically, for the basic code length $N_0$, the reliability of the $N_0$ polar channels is calculated, and a sequence of the serial numbers of the $N_0$ polar channels, namely, the first sequence, is determined based on the reliability of the $N_0$ polar channels.

The first determining module 602 is configured to determine N to-be-encoded bits, where the N to-be-encoded bits include N2 fixed bits, and N is greater than the basic code length $N_0$.

The extension module 603 is configured to extend the first sequence obtained by the obtaining module 601, to obtain a second sequence.

The second determining module 604 is configured to determine, based on polar channel serial numbers indicated by first N2 elements in the second sequence obtained by the extension module 603 through extension, locations of the N2 fixed bits in the N to-be-encoded bits determined by the first determining module 602.

The encoding module 605 is configured to perform polar encoding on the N to-be-encoded bits determined by the first determining module 602, to obtain encoded bits. Specifically, the encoding module 605 may use an encoding matrix FN of a polar code to complete an encoding process of the to-be-encoded bits, to obtain the encoded bits obtained after the polar encoding.

In an embodiment of the present disclosure, the extension module 603 is specifically configured to:

(a) use the first sequence as a to-be-extended sequence and extend the first sequence to obtain a third sequence, where the third sequence includes the to-be-extended sequence and an extension sequence, a length of the extension sequence is the same as a length of the to-be-extended sequence, and each element in the extension sequence is equal to an element located at a same location in the to-be-extended sequence plus the length of the to-be-extended sequence;

(b) insert the first element in the extension sequence into the to-be-extended sequence in the third sequence to form a fourth sequence, where a length of the fourth sequence is the same as a length of the third sequence;

(c) compare an insertion location at which the first element in the extension sequence is inserted into the to-be-extended sequence with the quantity N2 of fixed bits; and when the insertion location is less than N2, proceed to (d); otherwise, proceed to (e);

(d) use the fourth sequence as the to-be-extended sequence, to continue performing the foregoing (a), (b), and (c); and (e) use the fourth sequence as the second sequence.

For the foregoing operations (a), (b), (c), (d), and (e), further refer to the descriptions of S3301 to S3305 in the embodiment corresponding to FIG. 3. Details are not described herein again.

Figure 6B:
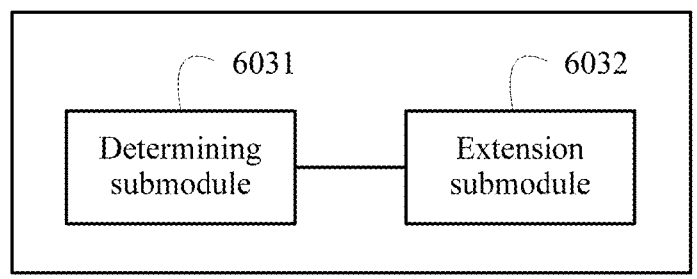
FIG. 6b is a structural diagram of an extension module 603 in an encoding apparatus 600 according to an embodiment of the disclosure.

In an embodiment of the present disclosure, the extension module 603 includes a determining submodule 6031 and an extension submodule 6032, as specifically shown in FIG. 6b.

The determining submodule 6031 is configured to determine a quantity K of extension times.

The extension submodule 6032 is configured to: use the first sequence as a to-be-extended sequence and extend the first sequence for K times to obtain a sequence that is extended for K times, and use the sequence that is extended for K times as the second sequence, where a sequence obtained after each time of extension is used as a to-be-extended sequence for a next time of extension, the sequence obtained after each time of extension includes a to-be-extended sequence and an extension sequence, a length of the extension sequence is the same as a length of the to-be-extended sequence, and each element in the extension sequence is equal to an element located at a same location in the to-be-extended sequence plus the length of the to-be-extended sequence.

Further, the determining submodule 6031 is specifically configured to:

determine, through table lookup, an insertion location sequence P corresponding to the basic code length $N_0$; and sequentially compare each element starting from the first element in the insertion location sequence P with the quantity N2 of fixed bits, until an element not less than N2 is determined, and use, as the quantity K of extension times, a quantity of times of comparison performed starting from the first element until the element not less than N2 is determined.

For functions of the determining submodule 6031 and the extension submodule 6032, further refer to the descriptions of S3311 and S3312 in the embodiment corresponding to FIG. 3. Details are not described herein again.

In an embodiment of the present disclosure, in a scenario in which rate matching does not need to be performed, the first determining module 602 is specifically configured to determine N based on M, where N=M, M is a target code length that is output based on a polar code, M is equal to 2 raised to the power of a positive integer, and M is a positive integer.

Correspondingly, the second determining module 604 is specifically configured to use the polar channel serial numbers indicated by the first N2 elements in the second sequence as the locations of the N2 fixed bits in the N to-be-encoded bits.

In another embodiment of the present disclosure, in a scenario in which rate matching needs to be performed, the first determining module 602 is specifically configured to determine N based on M, where $N=2^{\lfloor log_2(M-1)\rfloor+1}$, the symbol $\lfloor\ \rfloor$ represents rounding down, M is a target code length that is output based on a polar code, M is not equal to 2 raised to the power of a positive integer, and M is a positive integer.

In this case, as shown in FIG. 6a, the encoding apparatus 600 further includes a third determining module 606, configured to determine (M−N) deletion locations, where the (M−N) deletion locations are used to implement rate matching.

Correspondingly, the second determining module 604 is specifically configured to:

determine that there are S deletion locations in the first N2 elements in the second sequence, where $0 \leq S \leq (M-N)$; and use first (N2−M+N) elements in a fifth sequence and the (M−N) deletion locations as the locations of the N2 fixed bits in the N to-be-encoded bits, where the fifth sequence is a sequence including elements other than the S deletion locations in the first N2 elements in the second sequence.

It may be learned from the foregoing that, when S=0, in other words, when the fifth sequence is equal to the second sequence, there is no deletion location in the first N2 elements in the second sequence, and polar channel serial numbers indicated by first (N2−M+N) elements in the second sequence and the (M−N) deletion locations are used as the locations of the N2 fixed bits in the N to-be-encoded bits; or when S=M−N, in other words, when all the (M−N) deletion locations belong to the first N2 elements in the second sequence, the polar channel serial numbers indicated by the first N2 elements in the second sequence are used as the locations of the N2 fixed bits in the N to-be-encoded bits.

In this embodiment, the locations of the fixed bits in the N to-be-encoded bits are determined based on the second sequence, and the second sequence is obtained by extending the first sequence corresponding to the basic code length $N_0$. Compared with the prior art in which locations of fixed bits need to be determined by online calculating reliability of polar channels, this can reduce complexity of determining locations of fixed bits during polar code construction, and further reduce complexity of determining locations of information bits during the polar code construction, thereby improving performance of the polar code.

Figure 7:
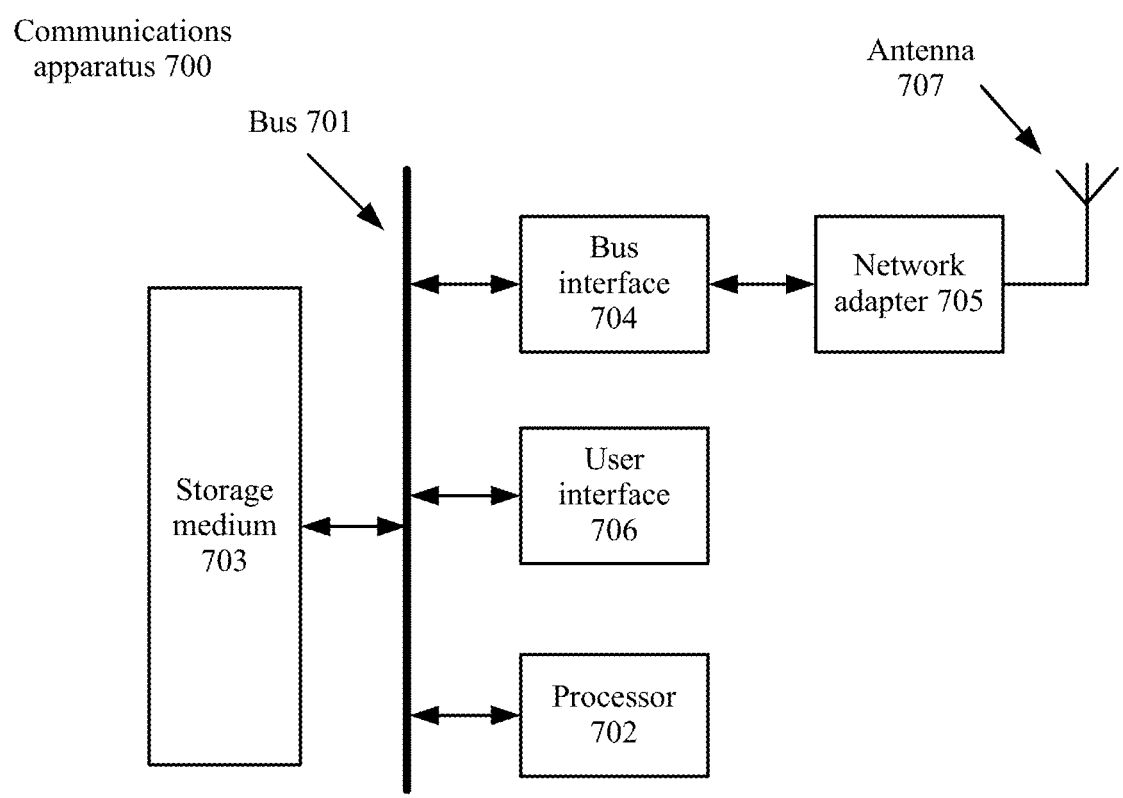
FIG. 7 is a structural diagram of a communications apparatus according to an embodiment of the disclosure.

FIG. 7 is a schematic structural diagram of a communications apparatus 700 according to an embodiment of the present disclosure (for example, a communications apparatus such as an access point, a base station, a station, or a terminal; or a chip in the communications apparatus).

The communications apparatus 700 may be implemented by using a bus 701 as a general bus architecture. The bus 701 may include any quantity of interconnected buses and bridges based on a specific application and an overall design constraint condition of the communications apparatus 700. The bus 701 connects various circuits together, and these circuits include a processor 702, a storage medium 703, and a bus interface 704. In one embodiment, the communications apparatus 700 uses the bus interface 704 to connect a network adapter 705 and the like by using the bus 701. The network adapter 705 may be configured to: implement a signal processing function of a physical layer in a wireless communications network, and send and receive a radio frequency signal by using an antenna 707. A user interface 706 may be connected to a user terminal, for example, a keyboard, a display, a mouse, or a joystick. The bus 701 may connect various other circuits, such as a timing source, a peripheral device, a voltage regulator, and a power management circuit. These circuits are well-known in the art, and therefore are not described in detail.

Alternatively, the communications apparatus 700 may be configured as a general-purpose processing system. For example, the general-purpose processing system is usually referred to as a chip. The general-purpose processing system includes one or more microprocessors that provide a processor function and an external memory that provides at least a part of the storage medium 703. All these components are connected to other supporting circuits by using an external bus architecture.

Alternatively, the communications apparatus 700 may be implemented by using an ASIC (application-specific integrated circuit) that includes the processor 702, the bus interface 704, and the user interface 706, and by using at least a part that is of the storage media 703 and that is integrated into a single chip. Alternatively, the communications apparatus 700 may be implemented by using one or more FPGAs (field programmable gate array), PLDs (programmable logic device), controllers, state machines, gate logic, discrete hardware components, any other appropriate circuits, or any combination of circuits that can perform various functions described throughout the present disclosure.

The processor 702 is responsible for bus management and general processing (including executing software stored in the storage medium 703). The processor 702 may be implemented by using one or more general-purpose processors and/or dedicated processors. Examples of the processor include a microprocessor, a microcontroller, a DSP processor, and other circuits that can execute software. The software should be broadly construed as a representation of instructions, data, or any combination thereof regardless of whether the software is referred to as software, firmware, middleware, microcode, hardware description language, or others.

The storage medium 703 is shown to be separated from the processor 702. However, a person skilled in the art easily understands that the storage medium 703 or any part of the storage medium 703 may be located outside the communications apparatus 700. For example, the storage medium 703 may include a transmission wire, a carrier waveform modulated by using data, and/or a computer product separated from a wireless node. All these media are accessible to the processor 702 by using the bus interface 704. Alternatively, the storage medium 703 or any part of the storage medium 703 may be integrated into the processor 702, for example, may be a cache and/or a general-purpose register.

Figure 4:
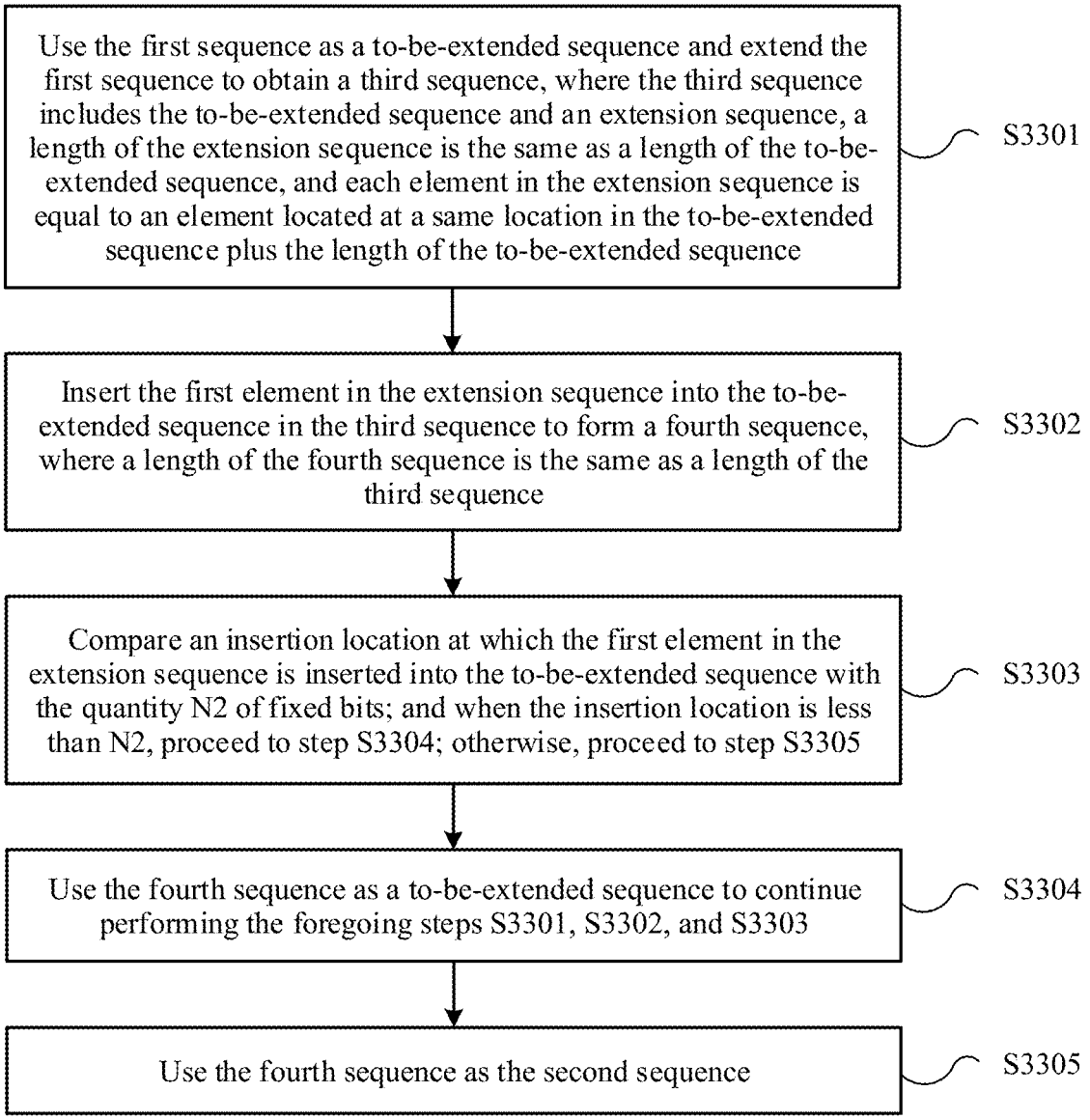
FIG. 4 is a flowchart of an implementation of operation 330 in an encoding method 300 according to an embodiment of the disclosure.
Figure 5:
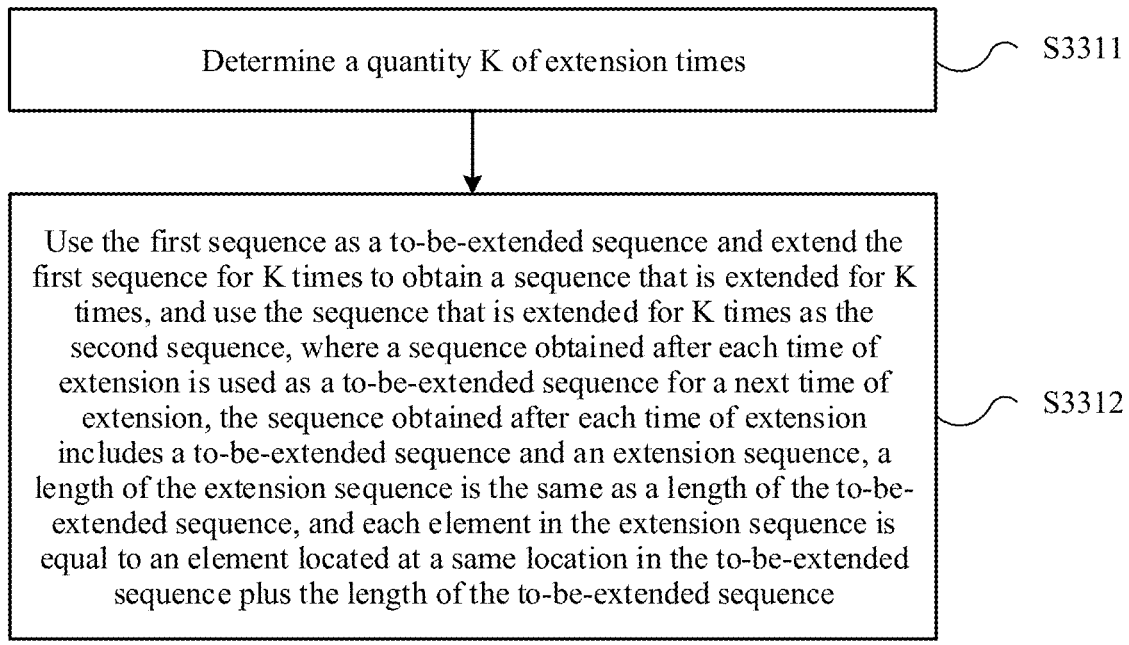
FIG. 5 is a flowchart of another implementation of operation 330 in an encoding method 300 according to an embodiment of the disclosure.

The processor 702 may perform, for example, the embodiments sequentially corresponding to FIG. 3, FIG. 4, and FIG. 5 in the foregoing embodiments, and details of an execution process of the processor 702 are not described herein again.

The communications apparatus described in this embodiment of the disclosure may be a wireless communications device such as an access point, a station, a base station, or a user terminal.

The polar code described in the embodiments of the disclosure includes but is not limited to an Arikan polar code, and may be alternatively a CA-polar code or a PC-polar code. The Arikan polar code is an original polar code, is not concatenated with another code, and includes only an information bit and a fixed bit. The CA-polar code is a polar code concatenated with a cyclic redundancy check (CRC) code. The PC-polar code is a polar code concatenated with a parity check (PC) code. The PC-polar code and the CA-polar code improve performance of the polar code by concatenating the original code with different codes.

In the examples described in the embodiments of the disclosure, units and method processes can be implemented by electronic hardware or a combination of computer software and electronic hardware. Whether the functions are performed by hardware or software depends on particular applications and design constraint conditions of the technical solutions. A person skilled in the art can implement the described functions by using different methods for each particular application.

In the several embodiments provided in the disclosure, it should be understood that the disclosed apparatus and method may be implemented in other manners. For example, the described apparatus embodiments are merely examples. For example, the unit division is merely logical function division, and there may be another division manner during actual implementation. For example, a plurality of units or components may be combined or integrated into another system, or some operations may be ignored or not performed. In addition, couplings, direct couplings, or communication connections between the units may be implemented by using some interfaces, and these interfaces may be in electronic, mechanical, or other forms.

The units described as separate parts may or may not be physically separate, and may be located in one location or may be distributed on a plurality of network units.

In addition, the function units in the embodiments of the disclosure may be integrated into one processing unit, or each of the units may exist alone physically, or two or more units may be integrated into one unit.

All or some of the foregoing embodiments may be implemented by software, hardware, firmware, or any combination thereof. When software is used to implement the embodiments, all or some of the embodiments may be implemented in a form of a computer program product. The computer program product includes one or more computer instructions. When the computer program instructions are loaded and executed on a computer, all or some of the procedures or functions according to the embodiments of the present disclosure are generated. The computer may be a general-purpose computer, a dedicated computer, a computer network, or other programmable apparatuses. The computer instructions may be stored in a computer readable storage medium or transmitted from a computer readable storage medium to another computer readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer readable storage medium may be any usable medium accessible to a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk Solid State Disk (SSD), or the like.

What is claimed is:

1. An encoding method, comprising:
    obtaining a first sequence corresponding to a basic code length $N_0$, wherein the first sequence comprises serial numbers of $N_0$ polar channels corresponding to the basic code length $N_0$, wherein $N_0$ comprises a first integer;
    determining N to-be-encoded bits, wherein the N to-be-encoded bits comprise N2 fixed bits, and N is greater than the basic code length $N_0$, wherein N comprises a second integer and N2 comprises a third integer;
    modifying the first sequence to obtain a second sequence;
    determining locations of the N2 fixed bits in the N to-be-encoded bits based on polar channel serial numbers indicated by first N2 elements in the second sequence; and
    performing polar encoding on the N to-be-encoded bits to obtain encoded bits.

2. The method according to claim 1, wherein the modifying the first sequence to obtain a second sequence comprises:
    (a) using the first sequence as a to-be-extended sequence and modifying the first sequence to obtain a third sequence, wherein the third sequence consists of the to-be-extended sequence and an extension sequence, a length of the extension sequence is the same as a length of the to-be-extended sequence, and each element in the extension sequence is equal to an element located at a respective location in the to-be-extended sequence;
    (b) inserting the first element in the extension sequence into the to-be-extended sequence in the third sequence to form a fourth sequence, wherein a length of the fourth sequence is the same as a length of the third sequence;
    (c) comparing an insertion location at which the first element in the extension sequence is inserted into the to-be-extended sequence with the quantity N2 of fixed bits; and when the insertion location is less than N2, proceeding to (d); otherwise, proceeding to (e);
    (d) using the fourth sequence as the to-be-extended sequence to continue performing the foregoing (a), (b), and (c); and
    (e) using the fourth sequence as the second sequence.

3. The method according to claim 1, wherein the modifying the first sequence to obtain a second sequence comprises:
    determining a quantity K of extension times, wherein K comprises a fourth integer; and
    using the first sequence as a to-be-extended sequence and modifying the first sequence for K times to obtain a sequence that is extended for K times, and using the sequence that is extended for K times as the second sequence, wherein a sequence obtained after each time of extension is used as a to-be-extended sequence for a next time of extension, the sequence obtained after each time of extension consists of a to-be-extended sequence and an extension sequence, a length of the extension sequence is the same as a length of the to-be-extended sequence, and each element in the extension sequence is equal to an element located at a respective location in the to-be-extended sequence.

4. The method according to claim 3, wherein the determining the quantity K of extension times comprises:
    determining, through table lookup, an insertion location sequence corresponding to the basic code length $N_0$; and
    sequentially comparing each element starting from the first element in the insertion location sequence with the quantity N2 of fixed bits, until an element not less than N2 is determined, and using, as the quantity K of extension times, a quantity of times of comparison performed starting from the first element until the element not less than N2 is determined.

5. The method according to claim 1, wherein the determining N to-be-encoded bits comprises:
    determining N based on M, wherein N=M, M is a target code length that is output based on a polar code, M is equal to 2 raised to the power of a positive integer, and M is a positive integer.

6. The method according to claim 5, wherein the determining locations of the N2 fixed bits in the N to-be-encoded bits based on polar channel serial numbers indicated by first N2 elements in the second sequence comprises:
    using the polar channel serial numbers indicated by the first N2 elements in the second sequence as the locations of the N2 fixed bits in the N to-be-encoded bits.

7. The method according to claim 1, wherein the determining N to-be-encoded bits comprises:
    determining N based on M, wherein $N=2^{\lfloor log_2(M-1) \rfloor +1}$, the symbol $\lfloor \ \rfloor$ represents rounding down, M is a target code length that is output based on a polar code, M is not equal to 2 raised to the power of a positive integer, and M is a positive integer.

8. The method according to claim 7, wherein after the determining N to-be-encoded bits, the method further comprises:
    determining (M−N) deletion locations, wherein the (M−N) deletion locations are used to implement rate matching; and
    the determining locations of the N2 fixed bits in the N to-be-encoded bits based on polar channel serial numbers indicated by first N2 elements in the second sequence comprises:
    determining that there are S deletion locations in the first N2 elements in the second sequence, wherein 0≤S≤ (M−N); and using first (N2−M+N) elements in a fifth sequence and the (M−N) deletion locations as the locations of the N2 fixed bits in the N to-be-encoded bits, wherein the fifth sequence is a sequence consisting of elements other than the S deletion locations in the first N2 elements in the second sequence.

9. The method according to claim 1, wherein the obtaining a first sequence corresponding to a basic code length $N_0$ comprises:
obtaining, through table lookup, the first sequence corresponding to the basic code length $N_0$.

10. The method according to claim 1, wherein the obtaining a first sequence corresponding to a basic code length $N_0$ comprises:
determining the first sequence based on reliability of the $N_0$ polar channels corresponding to the basic code length $N_0$.

11. An encoding apparatus, comprising:
an obtaining module, configured to obtain a first sequence corresponding to a basic code length $N_0$, wherein the first sequence comprises serial numbers of $N_0$ polar channels corresponding to the basic code length $N_0$, wherein $N_0$ comprises a first integer;
a first determining module, configured to determine N to-be-encoded bits, wherein the N to-be-encoded bits comprise N2 fixed bits, and N is greater than the basic code length $N_0$, wherein N comprises a second integer and N2 comprises a third integer;
an extension module, configured to extend the first sequence obtained by the obtaining module, to obtain a second sequence;
a second determining module, configured to determine locations of the N2 fixed bits in the N to-be-encoded bits based on polar channel serial numbers indicated by first N2 elements in the second sequence obtained by the extension module through extension; and
an encoding module, configured to perform polar encoding on the N to-be-encoded bits determined by the first determining module, to obtain encoded bits.

12. The encoding apparatus according to claim 11, wherein the extension module is specifically configured to:
(a) use the first sequence as a to-be-extended sequence and extend the first sequence to obtain a third sequence, wherein the third sequence consists of the to-be-extended sequence and an extension sequence, a length of the extension sequence is the same as a length of the to-be-extended sequence, and each element in the extension sequence is equal to an element located at a respective location in the to-be-extended sequence;
(b) insert the first element in the extension sequence into the to-be-extended sequence in the third sequence to form a fourth sequence, wherein a length of the fourth sequence is the same as a length of the third sequence;
(c) compare an insertion location at which the first element in the extension sequence is inserted into the to-be-extended sequence with the quantity N2 of fixed bits; and when the insertion location is less than N2, proceed to (d); otherwise, proceed to (e);
(d) use the fourth sequence as the to-be-extended sequence to continue performing the foregoing (a), (b), and (c); and
(e) use the fourth sequence as the second sequence.

13. The encoding apparatus according to claim 11, wherein the extension module comprises:
a determining submodule, configured to determine a quantity K of extension times, wherein K comprises a fourth integer; and
an extension submodule, configured to: use the first sequence as a to-be-extended sequence and extend the first sequence for K times to obtain a sequence that is extended for K times, and use the sequence that is extended for K times as the second sequence, wherein a sequence obtained after each time of extension is used as a to-be-extended sequence for a next time of extension, the sequence obtained after each time of extension consists of a to-be-extended sequence and an extension sequence, a length of the extension sequence is the same as a length of the to-be-extended sequence, and each element in the extension sequence is equal to an element located at a respective location in the to-be-extended sequence.

14. The encoding apparatus according to claim 13, wherein the determining submodule is specifically configured to:
determine, through table lookup, an insertion location sequence corresponding to the basic code length $N_0$; and
sequentially compare each element starting from the first element in the insertion location sequence with the quantity N2 of fixed bits, until an element not less than N2 is determined, and use, as the quantity K of extension times, a quantity of times of comparison performed starting from the first element until the element not less than N2 is determined.

15. The encoding apparatus according to claim 11, wherein the first determining module is specifically configured to:
determine N based on M, wherein N=M, M is a target code length that is output based on a polar code, M is equal to 2 raised to the power of a positive integer, and M is a positive integer.

16. The encoding apparatus according to claim 15, wherein the second determining module is specifically configured to:
use the polar channel serial numbers indicated by the first N2 elements in the second sequence as the locations of the N2 fixed bits in the N to-be-encoded bits.

17. The encoding apparatus according to claim 11, wherein the first determining module is specifically configured to:
determine N based on M, wherein $N=2^{\lfloor log_2(M-1) \rfloor+1}$, the symbol $\lfloor \ \rfloor$ represents rounding down, M is a target code length that is output based on a polar code, M is not equal to 2 raised to the power of a positive integer, and M is a positive integer.

18. The encoding apparatus according to claim 17, further comprising:
a third determining unit, configured to determine (M−N) deletion locations, wherein the (M−N) deletion locations are used to implement rate matching; and
the second determining module is specifically configured to:
determine that there are S deletion locations in the first N2 elements in the second sequence, wherein 0≤S≤(M−N); and
use first (N2−M+N) elements in a fifth sequence and the (M−N) deletion locations as the locations of the N2 fixed bits in the N to-be-encoded bits, wherein the fifth sequence is a sequence consisting of elements other than the S deletion locations in the first N2 elements in the second sequence.

19. The method according to claim 11, wherein the obtaining module is specifically configured to:

obtain, through table lookup, the first sequence corresponding to the basic code length $N_0$.

20. The method according to claim 11, wherein the obtaining module is specifically configured to:
determine the first sequence based on reliability of the $N_0$ polar channels corresponding to the basic code length $N_0$.

21. A communications apparatus, comprising:
a memory, configured to store a program; and
a processor, configured to execute the program stored in the memory, wherein when the program is executed, the processor is configured to perform operations comprising:
obtaining a first sequence corresponding to a basic code length $N_0$, wherein the first sequence comprises serial numbers of $N_0$ polar channels corresponding to the basic code length $N_0$, wherein $N_0$ comprises a first integer;
determining N to-be-encoded bits, wherein the N to-be-encoded bits comprise N2 fixed bits, and N is greater than the basic code length $N_0$, wherein N comprises a second integer and N2 comprises a third integer;
modifying the first sequence to obtain a second sequence;
determining locations of the N2 fixed bits in the N to-be-encoded bits based on polar channel serial numbers indicated by first N2 elements in the second sequence; and
performing polar encoding on the N to-be-encoded bits to obtain encoded bits.

* * * * *